(12) United States Patent
Bao et al.

(10) Patent No.: US 11,901,434 B2
(45) Date of Patent: Feb. 13, 2024

(54) SEMICONDUCTOR HAVING A SOURCE/DRAIN CONTACT WITH A SINGLE INNER SPACER

(71) Applicant: QUALCOMM Incorporated, San Diego, CA (US)

(72) Inventors: Junjing Bao, San Diego, CA (US); Haining Yang, San Diego, CA (US); Youseok Suh, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 164 days.

(21) Appl. No.: 17/245,695

(22) Filed: Apr. 30, 2021

(65) Prior Publication Data

US 2022/0352347 A1 Nov. 3, 2022

(51) Int. Cl.
| | |
|---|---|
| *H01L 29/66* | (2006.01) |
| *H01L 21/02* | (2006.01) |
| *H01L 21/768* | (2006.01) |
| *H01L 23/535* | (2006.01) |
| *H01L 29/417* | (2006.01) |

(52) U.S. Cl.
CPC .... *H01L 29/66515* (2013.01); *H01L 21/0217* (2013.01); *H01L 21/76805* (2013.01); *H01L 21/76831* (2013.01); *H01L 21/76895* (2013.01); *H01L 21/76897* (2013.01); *H01L 23/535* (2013.01); *H01L 29/41775* (2013.01)

(58) Field of Classification Search
CPC ......... H01L 29/41775; H01L 29/66515; H01L 21/0217; H01L 21/76805; H01L 21/76831; H01L 21/76895; H01L 21/76897; H01L 23/535
See application file for complete search history.

(56) References Cited

U.S. PATENT DOCUMENTS

| | | | |
|---|---|---|---|
| 9,812,400 B1* | 11/2017 | Basker | H01L 21/76895 |
| 9,881,834 B1* | 1/2018 | Sun | H01L 21/31144 |
| 2017/0186849 A1* | 6/2017 | Chen | H01L 21/76883 |
| 2017/0317076 A1 | 11/2017 | Shen et al. | |
| 2018/0076139 A1* | 3/2018 | Liu | H01L 23/53209 |
| 2018/0138176 A1* | 5/2018 | Shen | H01L 29/0847 |
| 2019/0304843 A1 | 10/2019 | Sirman et al. | |
| 2020/0258778 A1* | 8/2020 | Lilak | H01L 27/0924 |

(Continued)

OTHER PUBLICATIONS

International Search Report and Written Opinion—PCT/US2022/071376—ISA/EPO—dated Jul. 7, 2022.

(Continued)

*Primary Examiner* — Shahed Ahmed
*Assistant Examiner* — Vicki B. Booker
(74) *Attorney, Agent, or Firm* — Muncy, Geissler, Olds & Lowe, P.C./Qualcomm Incorporated (57) ABSTRACT

In some aspects, a semiconductor die includes an insulation layer disposed on a substrate, a gate spacer disposed in the insulation layer, a gate disposed between the gate spacer, a first dielectric gate layer disposed on the gate between the gate spacer, a second dielectric gate layer disposed on the first dielectric gate layer between the gate spacer, a gate contact coupled to the gate and in contact with the first dielectric gate layer and the second dielectric gate layer, and a source/drain contact that has a single inner spacer.

19 Claims, 10 Drawing Sheets

(56) References Cited

U.S. PATENT DOCUMENTS

2020/0343138 A1* 10/2020 Jisong ............... H01L 21/76897
2022/0310445 A1* 9/2022 Lee ....................... H01L 29/785

OTHER PUBLICATIONS

Niebojewski H., et al., "Self-Aligned Contacts for 10nm FDSOI Node: From Device to Circuit Evaluation", 2013 IEEE SCI-3D-Subthreshold Microelectronics Technology Unified Conference (S3S), IEEE, Oct. 7, 2013 (Oct. 7, 2013), pp. 1-2, XP032564840, DOI: 10.1109/S3S.2013.6716549, [retrieved on Jan. 17, 2014], The whole document.

* cited by examiner

//  SEMICONDUCTOR HAVING A SOURCE/DRAIN CONTACT WITH A SINGLE INNER SPACER

BACKGROUND OF THE DISCLOSURE

1. Field of the Disclosure

Aspects of this disclosure relate generally to a semiconductor or integrated circuit (IC), and particularly to a semiconductor having a source/drain contact with single inner spacer.

2. Description of the Related Art

In a semiconductor (also known as a chip or integrated circuit (IC)), a dual inner spacer dielectric spacer in a CA (e.g., a source/drain contact) and a single dielectric spacer in a CB (e.g., a gate contact) may be used in a local interconnect to reduce the possibility of a short occurring between CA and CB. Such an arrangement results in a reduction in a size of the CA on the source/drain, thereby causing high contact resistance and therefore lower circuit performance.

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In a first aspect, a semiconductor die includes an insulation layer disposed on a substrate, a gate spacer disposed in the insulation layer, a gate disposed between the gate spacer, a first dielectric gate layer disposed on the gate between the gate spacer, a second dielectric gate layer disposed on the first dielectric gate layer between the gate spacer, a gate contact coupled to the gate and in contact with the first dielectric gate layer and the second dielectric gate layer, and a source/drain contact that has a single inner spacer.

In a second aspect, forming a semiconductor die includes disposing an insulation layer on a substrate, disposing a gate spacer in the insulation layer, disposing a gate between the gate spacer, disposing a first dielectric gate layer on the gate between the gate spacer, disposing a second dielectric gate layer on the first dielectric gate layer between the gate spacer, forming a gate contact coupled to the gate and in contact with the first dielectric gate layer and the second dielectric gate layer, and forming a source/drain contact having a single inner spacer.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof. A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Disclosed are systems and techniques to form a semiconductor with a single inner spacer local interconnect. A single inner spacer, e.g., a single dielectric inner spacer in a CA (source/drain contact) and no spacer in a CB (gate contact) provides for higher circuit performance. However, atomic layer deposition (ALD) in a self-aligned contact (SAC) process may result in Silicon Nitride (SiN) seam voids on the gate that may trap Titanium Nitride (TiN), causing electrical shorts between the gate contact and CM (a local interconnect routing located above the CA and the CB). When using a gate made of polycrystalline silicon (also called polysilicon), preferably the gate is sufficiently tall to reduce parasitic capacitance. However, using a high aspect ratio for ALD SiN cap deposition may lead to seam voids that can cause electrical shorts. The systems and techniques described herein use a single inner spacer local interconnect to provide higher performance. The local interconnect includes two layers of dielectric as the cap on the gate, with the 1st layer including an oxide-based dielectric and the 2nd layer including a nitride-based dielectric. Both layers are seamless in the final stack to prevent contact shorts.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "example" and/or "example" are used herein to mean "serving as an example, instance, or illustration." Any aspect described herein as "example" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

As used herein, the terms "user equipment" (UE) and "base station" are not intended to be specific or otherwise limited to any particular radio access technology (RAT), unless otherwise noted. In general, a UE may be any wireless communication device (e.g., a mobile phone, router, tablet computer, laptop computer, consumer asset tracking device, wearable device (e.g., smartwatch, glasses, augmented reality (AR)/virtual reality (VR) headset, etc.), vehicle (e.g., automobile, motorcycle, bicycle, etc.), Internet of Things (IoT) device, etc.) used by a user to communicate over a wireless communications network. A UE may be mobile or may (e.g., at certain times) be stationary, and may communicate with a radio access network (RAN). As used herein, the term "UE" may be referred to interchangeably as an "access terminal" or "AT," a "client device," a "wireless device," a "subscriber device," a "subscriber terminal," a "subscriber station," a "user terminal" or UT, a "mobile device," a "mobile terminal," a "mobile station," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, wireless local area network (WLAN) networks (e.g., based on Institute of Electrical and Electronics Engineers (IEEE) 802.11, etc.) and so on.

A base station may operate according to one of several RATs in communication with UEs depending on the network in which it is deployed, and may be alternatively referred to as an access point (AP), a network node, a NodeB, an evolved NodeB (eNB), a next generation eNB (ng-eNB), a New Radio (NR) Node B (also referred to as a gNB or gNodeB), etc. A base station may be used primarily to support wireless access by UEs, including supporting data, voice, and/or signaling connections for the supported UEs. In some systems a base station may provide purely edge node signaling functions while in other systems it may provide additional control and/or network management functions. A communication link through which UEs can send RF signals to a base station is called an uplink (UL) channel (e.g., a reverse traffic channel, a reverse control channel, an access channel, etc.). A communication link through which the base station can send RF signals to UEs is called a downlink (DL) or forward link channel (e.g., a paging channel, a control channel, a broadcast channel, a forward traffic channel, etc.). As used herein the term traffic channel (TCH) can refer to either an uplink/reverse or downlink/forward traffic channel.

The term "base station" may refer to a single physical transmission-reception point (TRP) or to multiple physical TRPs that may or may not be co-located. For example, where the term "base station" refers to a single physical TRP, the physical TRP may be an antenna of the base station corresponding to a cell (or several cell sectors) of the base station. Where the term "base station" refers to multiple co-located physical TRPs, the physical TRPs may be an array of antennas (e.g., as in a multiple-input multiple-output (MIMO) system or where the base station employs beamforming) of the base station. Where the term "base station" refers to multiple non-co-located physical TRPs, the physical TRPs may be a distributed antenna system (DAS) (a network of spatially separated antennas connected to a common source via a transport medium) or a remote radio head (RRH) (a remote base station connected to a serving base station). Alternatively, the non-co-located physical TRPs may be the serving base station receiving the measurement report from the UE and a neighbor base station whose reference RF signals (or simply "reference signals") the UE is measuring. Because a TRP is the point from which a base station transmits and receives wireless signals, as used herein, references to transmission from or reception at a base station are to be understood as referring to a particular TRP of the base station.

In some implementations that support positioning of UEs, a base station may not support wireless access by UEs (e.g., may not support data, voice, and/or signaling connections for UEs), but may instead transmit reference signals to UEs to be measured by the UEs, and/or may receive and measure signals transmitted by the UEs. Such a base station may be referred to as a positioning beacon (e.g., when transmitting signals to UEs) and/or as a location measurement unit (e.g., when receiving and measuring signals from UEs).

An "RF signal" comprises an electromagnetic wave of a given frequency that transports information through the space between a transmitter and a receiver. As used herein, a transmitter may transmit a single "RF signal" or multiple "RF signals" to a receiver. However, the receiver may receive multiple "RF signals" corresponding to each transmitted RF signal due to the propagation characteristics of RF signals through multipath channels. The same transmitted RF signal on different paths between the transmitter and receiver may be referred to as a "multipath" RF signal. As used herein, an RF signal may also be referred to as a "wireless signal," a "radar signal," a "radio wave," a "waveform," or the like, or simply a "signal" where it is clear from the context that the term "signal" refers to a wireless signal or an RF signal.

As a first example, an apparatus may include a semiconductor. The semiconductor may include an insulation layer disposed on a substrate, a gate spacer disposed in the insulation layer, a gate disposed in the gate spacer, a first dielectric gate layer disposed on the gate in the gate spacer, a second dielectric gate layer disposed on the first dielectric gate layer in the gate spacer, a gate contact electrically coupled to the gate and in direct contact with the first dielectric gate layer and with the second dielectric gate layer, and a source/drain contact located in a diffusion region. The source/drain contact has a single inner spacer. A local interconnect may be disposed on the source/drain contact in the diffusion region. The local interconnect may further be disposed on the second dielectric gate layer in the diffusion region. The gate contact may be located outside of the diffusion region. The substrate comprises Silicon. The insulation layer comprises Silicon Dioxide. The first dielectric gate layer comprises Silicon Dioxide. The second dielectric gate layer comprises a Silicon Nitride (SiN) layer that has a thickness of between about 1 nanometer to about 5 nanometers. The first dielectric gate layer and the second dielectric gate layer are seamless. The single inner spacer of the source/drain contact comprises Silicon Nitride. The apparatus is selected from a group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

As a second example forming a semiconductor may include disposing an insulation layer on a substrate, disposing a gate spacer in the insulation layer, disposing a gate in the gate spacer, disposing a first dielectric gate layer on the gate in the gate spacer, disposing a second dielectric gate layer on the first dielectric gate layer in the gate spacer, forming a gate contact that is electrically coupled to the gate and in direct contact with the first dielectric gate layer and with the second dielectric gate layer, and forming a source/drain contact having a single inner spacer in a diffusion region. Forming the semiconductor may include disposing a local interconnect on the source/drain contact in the diffusion region. Forming the semiconductor may include disposing the local interconnect on the second dielectric gate layer in the diffusion region. The gate contact may be located outside of the diffusion region. The substrate comprises Silicon. The insulation layer comprises Silicon Dioxide. The first dielectric gate layer comprises Silicon Dioxide. The second dielectric gate layer comprises a Silicon Nitride (SiN) layer that has a thickness of between about 1 nanometer to about 5 nanometers. The first dielectric gate layer and the second dielectric gate layer are seamless. The single inner spacer of the source/drain contact comprises Silicon Nitride.

Figure 1:
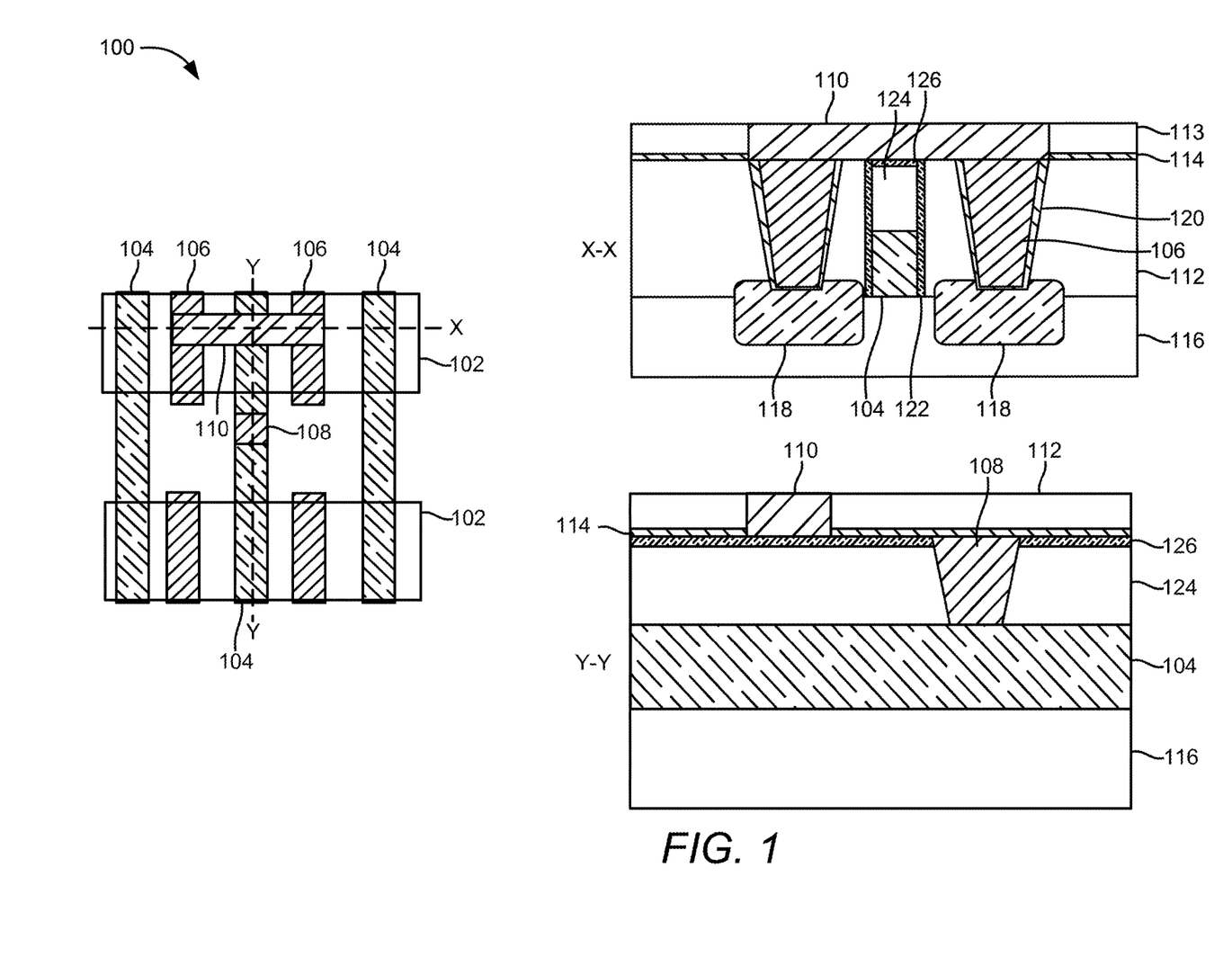
FIG. 1 illustrates a block diagram of an exemplary semiconductor that includes a single inner spacer local interconnect, according to various aspects of the disclosure.

FIG. 1 illustrates a block diagram of an exemplary semiconductor 100 that includes a single inner spacer local interconnect, according to various aspects of the disclosure. The semiconductor includes diffusion regions 102, one or more gates 104, one or more source/drain contacts 106, a gate contact 108, and a local interconnect routing 110. The local interconnect routing 110 may be located above the source/drain contacts 106 and above the gate contact 108.

The cross-section X-X illustrates the local interconnect routing 110, an insulation layer 113 (e.g., that includes Silicon Dioxide ($SiO_2$)), a top dielectric layer 114 (located above the $SiO_2$) that includes Silicon carbonitride (SiCN), a single dielectric layer 112 (e.g., insulation layer), and a substrate 116 (e.g., a Silicon (Si) layer). Below the local interconnect routing 110 are the (V-shaped) source/drain contacts 106 with inner spacer 120 that may, for example, include Silicon Nitride (SiN). A top portion of the source/drain contacts 106 is in contact with the local interconnect routing 110 while a bottom portion of the source/drain contacts 106 is in contact with epitaxial layers 118. Located on top of each gate 104 is a 1st layer 124 (e.g., a spin on Silicon Dioxide ($SiO_2$)) followed by a 2nd layer 126 (e.g., an atomic deposition layer (ALD) of a material such as SiN).

Each gate 104, the 1st layer 124 (e.g., spin $SiO_2$), and the 2nd layer 126 (e.g., ALD SiN), include a gate spacer 122 on either side. The gate spacer 122 may include SiOC, $SiO_2$, SiN, SiBCN etc.

The cross-section Y-Y illustrates the local interconnect routing 110, the insulation layer 113, the top dielectric layer 114, the single dielectric layer 112 (e.g., passivation layer), the 2nd layer 126 (e.g., ALD SiN), the 1st layer 124 (e.g., spin $SiO_2$), the gate 104, and the substrate 116 (e.g., Si). The gate contacts 108 are located between the top dielectric layer 114 and the gate 104. The gate 104 and the 1st layer 124 (e.g., spin $SiO_2$) may together be referred to as a polygate.

The semiconductor 100 illustrates how a single dielectric spacer 112 (e.g., that includes SiN or the like) is used for the source/drain contacts 106 while no spacer is used for the gate contact 108. The single dielectric spacer 112 reduces resistance to provide higher performance (e.g., as compared to dual spacers). Technical advantages of the semiconductor 100 include reducing (or eliminating) the possibility of a SiN seam void that traps TiN (e.g., when using atomic layer deposition (ALD) in a self-aligned contact (SAC)), thereby reducing (or eliminating) the possibility of an electrical short between the source/drain contacts and the gate contact and improved performance as a result.

Figure 2:
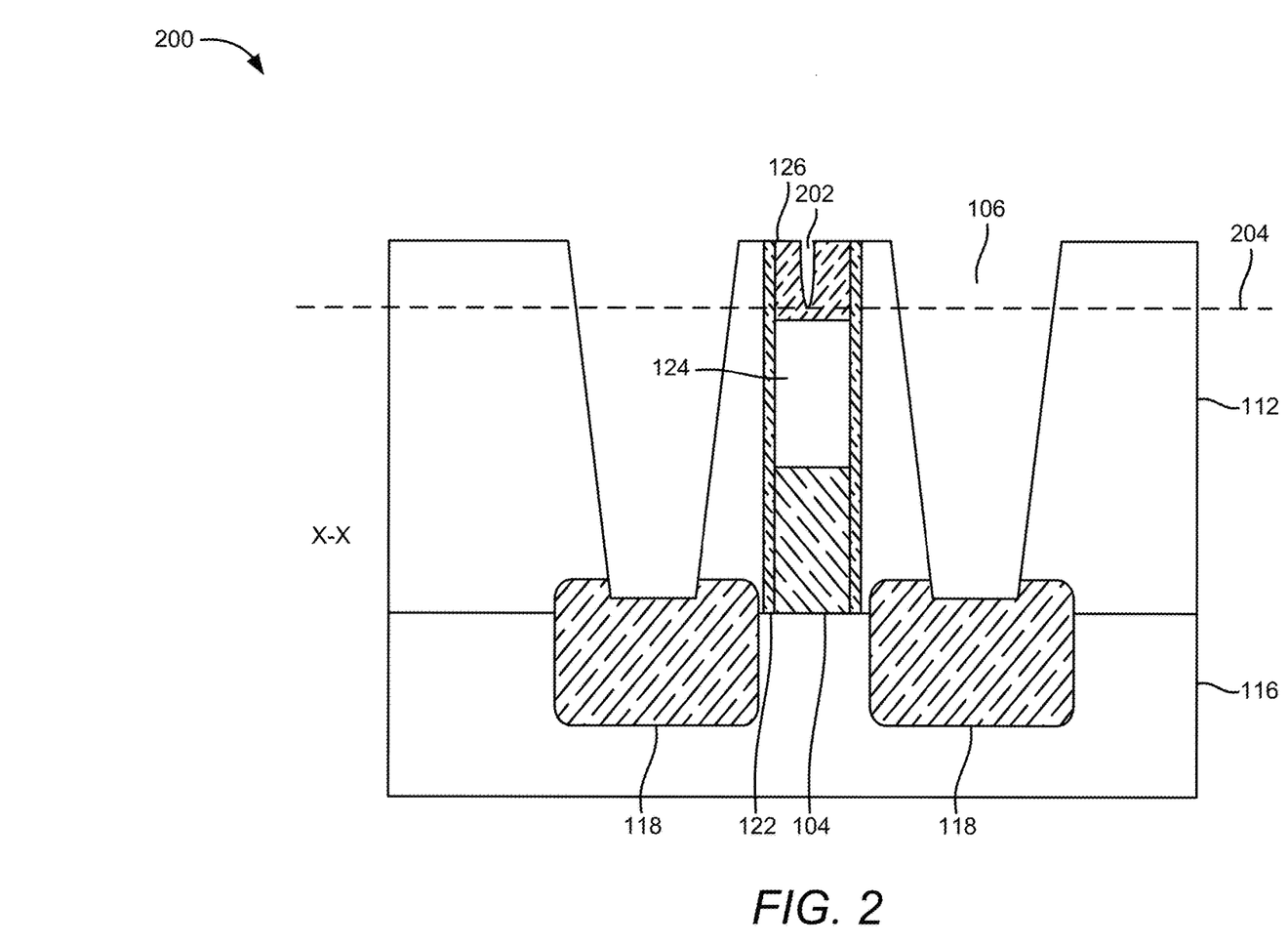
FIG. 2 illustrates a block diagram of a cross section of an exemplary semiconductor, according to various aspects of the disclosure.

FIG. 2 illustrates a block diagram of a cross section of an exemplary semiconductor 200, according to various aspects of the disclosure. The 2nd layer 126 (e.g., ALD SiN) may be used as a cap layer on the gate 104 to enable self-aligned patterning of the source/drain contacts 106. In a conventional semiconductor, seam voids, such as a representative seam void 202, in the SAC ALD SiN cap may trap a metal (e.g., TiN) during metal fill of the gate contact and of the source/drain contact, that may result in a short. In contrast, as illustrated in FIG. 2, the seamless 1st layer 124 (e.g., spin $SiO_2$) and the 2nd layer 126 (e.g., ALD SiN) enable a self-aligned contact etch. Because an aspect ratio (AR) of height to width is reduced after the 1st fill (e.g., the 1st layer 124), the 2nd layer 126 has a smaller seam void. In addition, a chemical-mechanical polish (CMP) performed at 204 polishes and reduces or removes any potential (e.g., small) seam voids, such as seam void 202, in the 2nd layer 126.

Figure 3A:
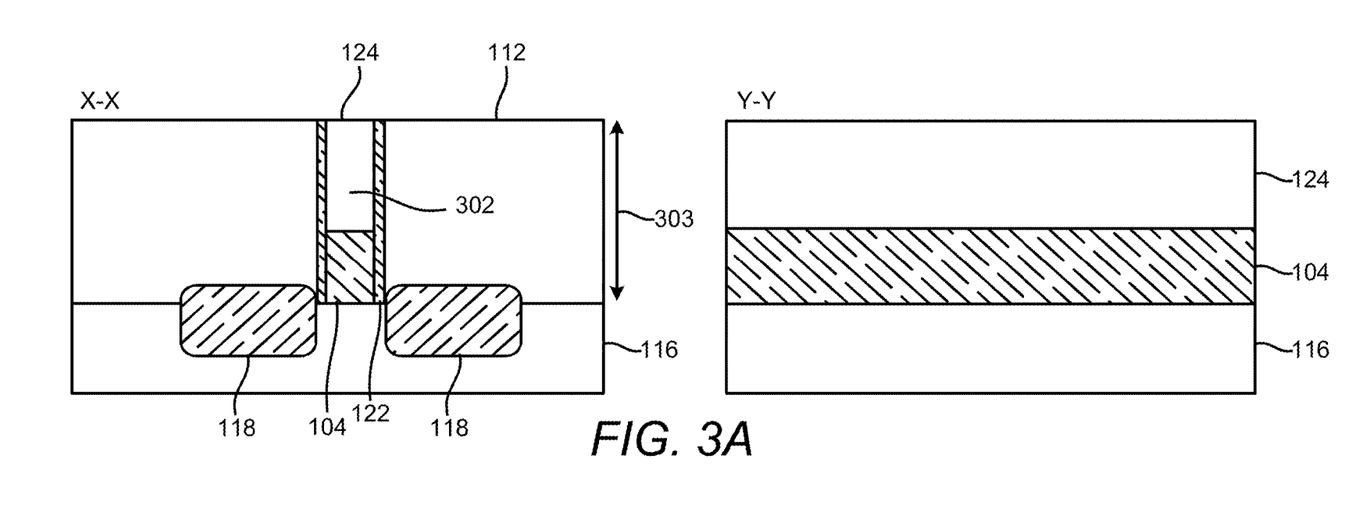
FIGS. 3A, 3B, 3C, 3D, 3E, 3F, 3G, 3H, and 3I illustrate different stages in forming an exemplary semiconductor, according to various aspects of the disclosure.
Figure 3B:
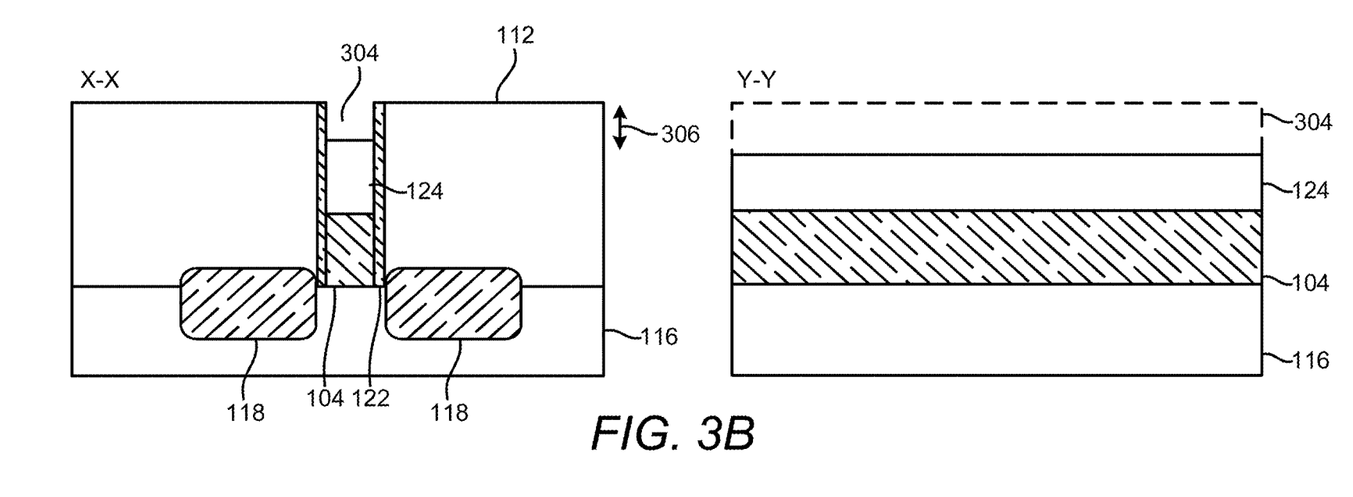

In FIG. 3A, after the formation of replacement high-k metal gate 104 and Tungsten (W) recess, the deposition of the 1st layer 124 (e.g., spin $SiO_2$) is performed followed by a chemical mechanical polish (CMP). A gate channel 302 that has a height 303 of between about 50 to about 100 nanometers (nm) is located between the gate spacer 122. A polysilicon gate, that includes the gate 104 and the 1st layer 124 (e.g., spin $SiO_2$), is located in the gate channel 302. In FIG. 3B, an etch is used to create a recess 304 in the 1st layer 124 (e.g., spin $SiO_2$). The recess 304 has a height 306 of between about 5 nm to about 10 nm.

Figure 3C:
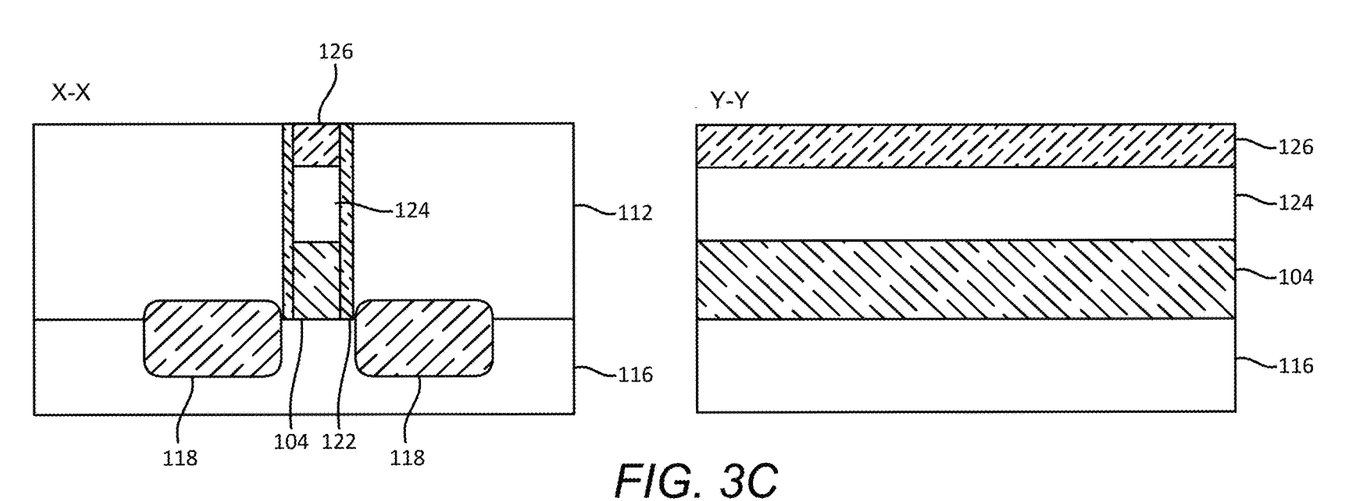
Figure 3D:
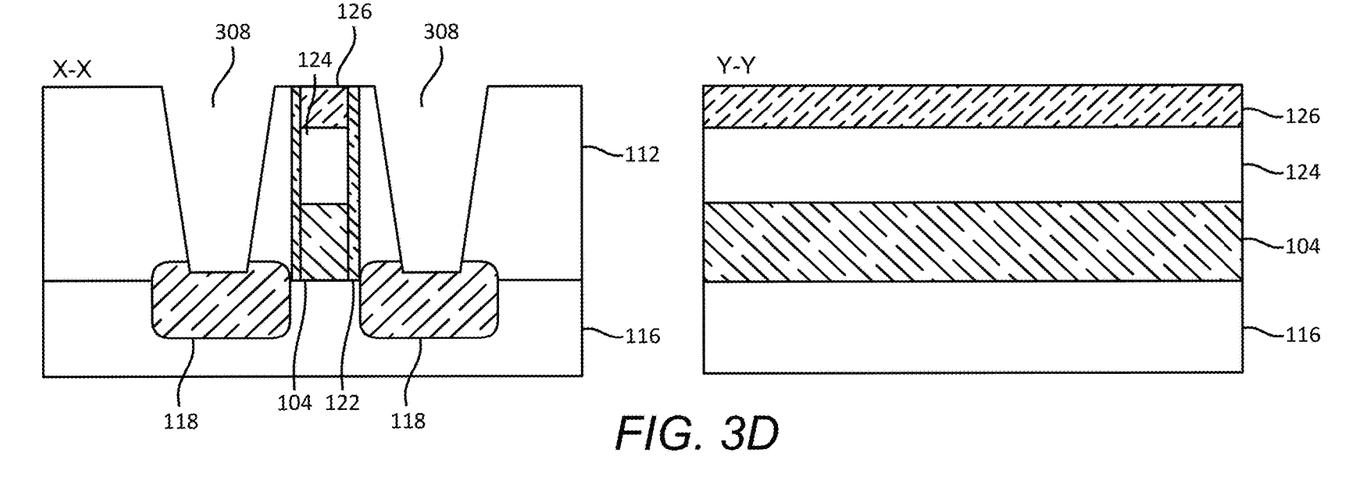

In FIG. 3C, the 2nd layer 126 (e.g., ALD SiN) is deposited and a CMP performed. In FIG. 3D, patterns 308 are created for the corresponding gates 104.

Figure 3E:
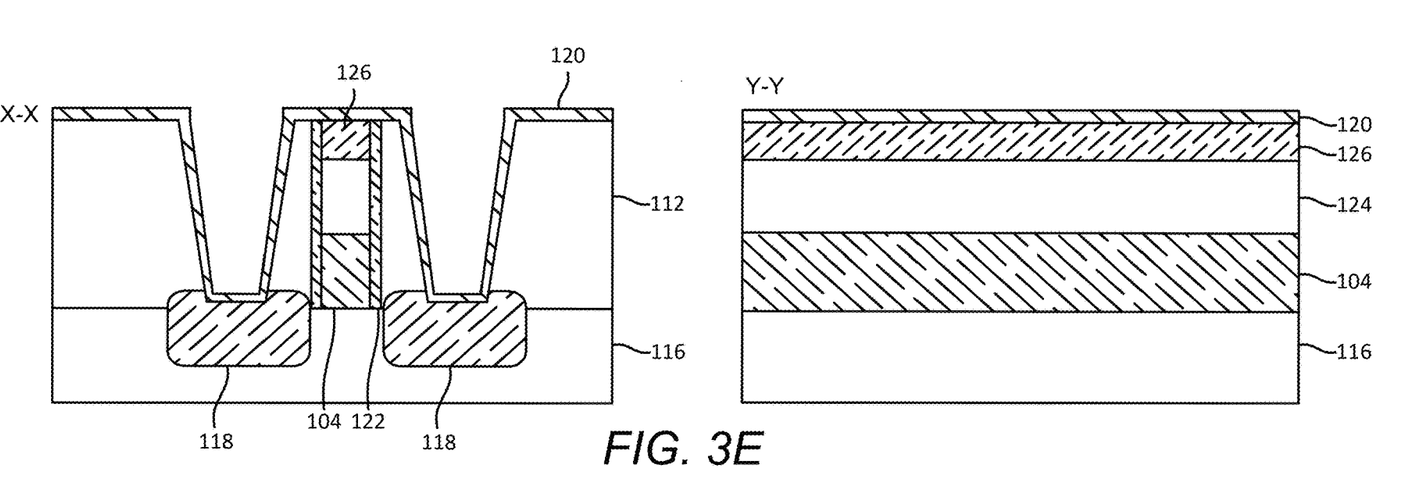
Figure 3F:
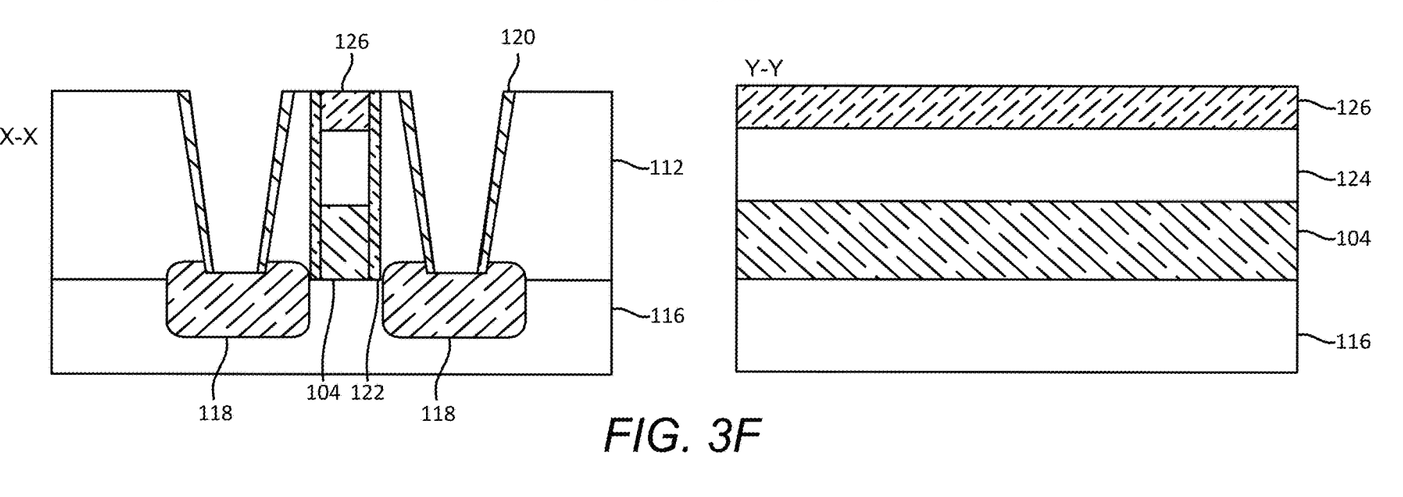

In FIG. 3E, the conformal SiN inner spacer 120 is deposited. In FIG. 3F, an etch (e.g., anisotropic etch) is performed to remove a horizontal portion of the inner spacer 120, as shown.

Figure 3G:
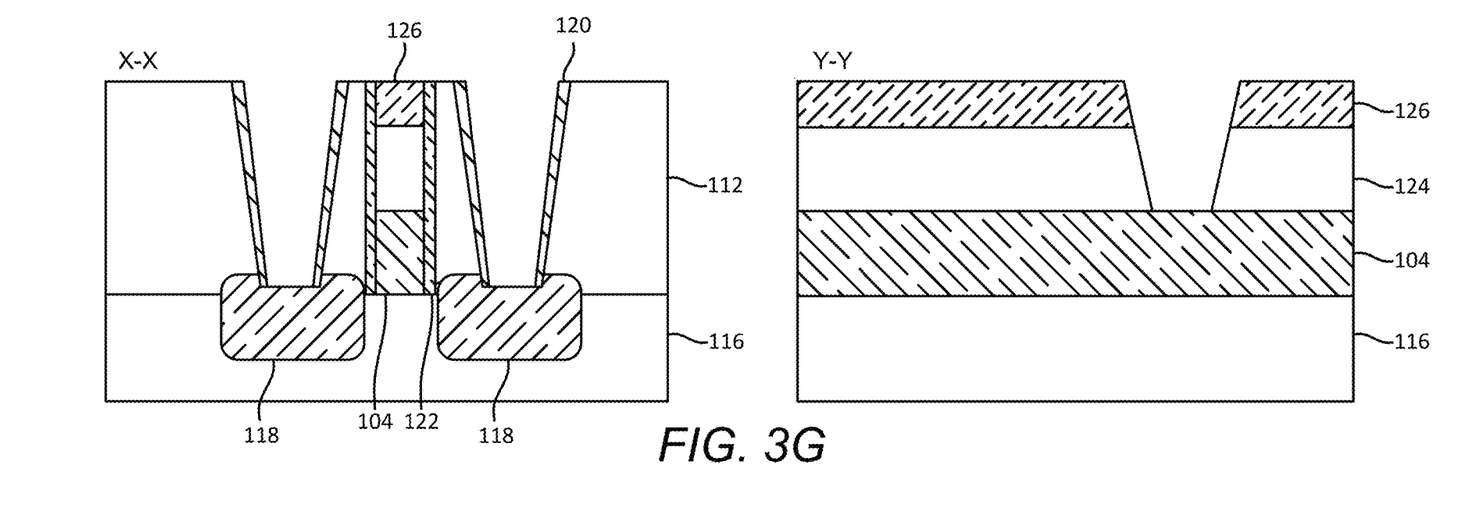
Figure 3H:
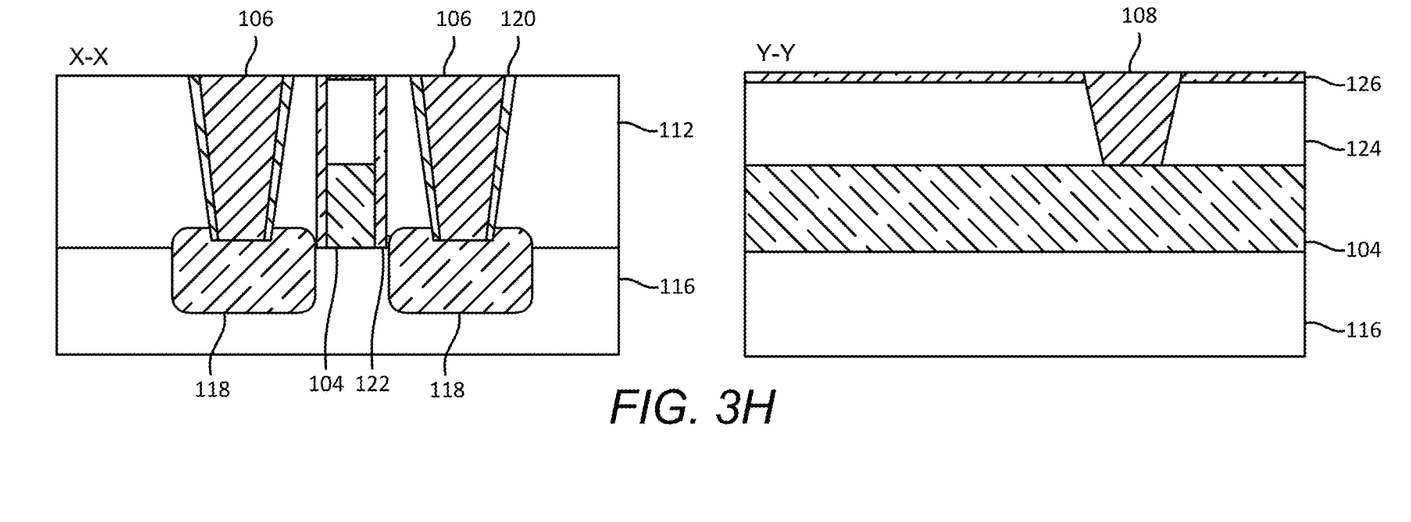
Figure 3I:
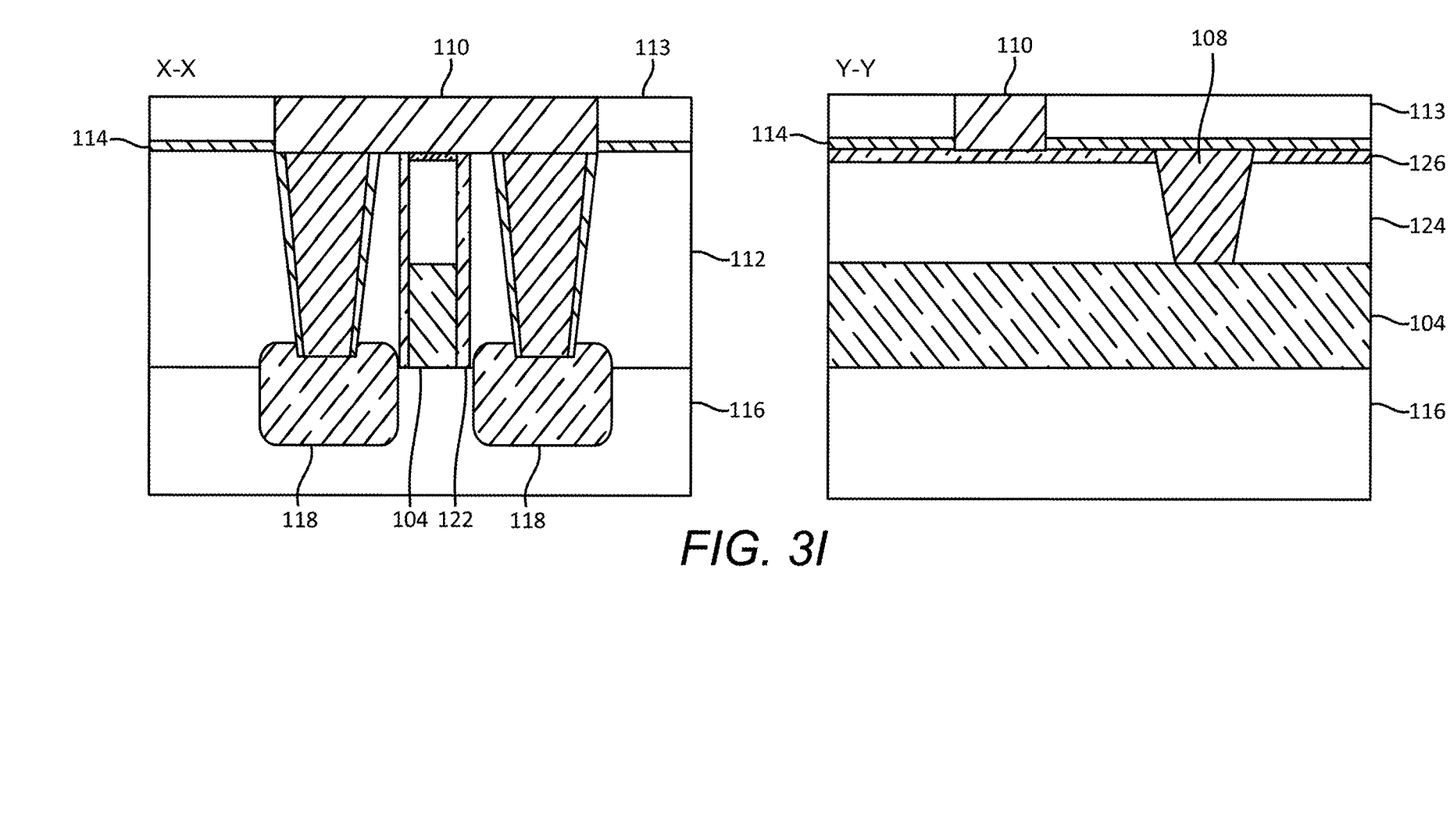

In FIG. 3G, the gate contacts 108 are patterned. In FIG. 3H, a metal, such as, for example, Titanium (Ti) or Titanium Nitride (TiN), is deposited as a barrier and a metal fill of the gate contacts 108 and the source/drain contacts 106 is performed. For example, Cobalt (Co), Tungsten (W) or the like may be used for the metal fill of the gate contacts 108 and the source/drain contacts 106. A CMP may be performed, leaving the 2nd layer 126 (e.g., ALD SiN) with a thickness of between about 1 nm to about 5 nm (e.g., on top of each of the gates 104). In FIG. 3I, the local interconnect routings 110 are formed using, for example, Cobalt (Co), Tungsten (W), or the like.

Thus, a semiconductor that includes a single inner spacer local interconnect, e.g., a single SiN inner spacer in the source/drain contact but no spacer in gate contact provides lower resistance and higher performance. The local interconnect includes two layers of dielectric cap on the gate, e.g., a 1st layer that is an oxide-based dielectric, and a 2nd layer that is a nitride-based dielectric. The two layers are seamless in the final stack, thereby preventing a contact short.

Figure 4:
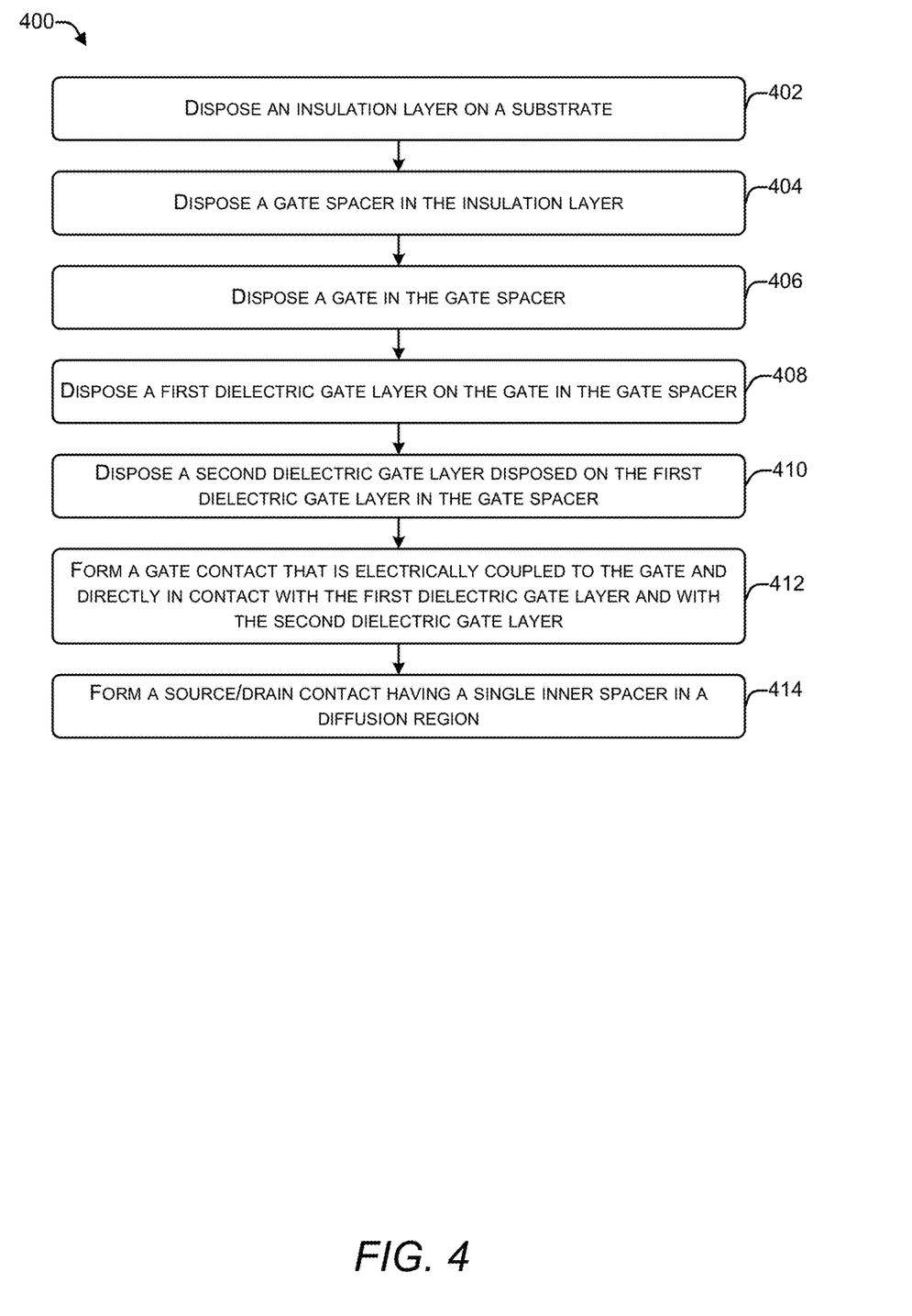
FIG. 4 illustrates an example process that includes forming local interconnects, according to aspects of the disclosure.

In the flow diagram of FIG. 4, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the process 400 is described with reference to FIGS. 1, 2, 3A, 3B, 3C, 3D, 3E, 3F, 3G, 3H, and 3I as described above, although other models, frameworks, systems and environments may be used to implement these processes.

FIG. 4 illustrates an example process 400 that includes forming local interconnects, according to aspects of the disclosure. The process 400 may be performed as part of a semiconductor manufacturing process.

At 402, the process 400 disposes and insulation layer on a substrate. For example, in FIG. 3A, after the process performs the RMG gate cut to create a gate recess, the process deposits the insulation layer, 1st layer 124 (e.g., spin $SiO_2$), and performs a CMP.

At 404, the process 400 disposes a gate spacer in the insulation layer. At 406, the process 400 disposes a gate in the gate spacer. For example, in FIG. 3E, the process deposits the conformal SiN inner spacer 120. In FIG. 3F, the process performs the etch (e.g., anisotropic etch) to remove a horizontal portion of the inner spacer 120.

At 408, the process 400 disposes the first dielectric gate layer on the gate in the gate spacer. For example, in FIG. 3G, the process patterns the gate contacts 108. In FIG. 3H, the process deposits a metal, such as, for example, Titanium (Ti) or Titanium Nitride (TiN), as a barrier and performs the metal fill of the gate contacts 108 and the source/drain contacts 106 using Cobalt (Co), Tungsten (W) or the like. The process may perform the CMP, leaving the 2nd layer 126 (e.g., ALD SiN) with a thickness of between about 1 nm to about 5 nm (e.g., on top of each of the gates 104).

At 410, the process 400 disposes a second dielectric gate layer disposed on the first dielectric gate layer in the gate spacer. For example, in FIG. 3C, the 2nd layer 126 (e.g., ALD SiN) is deposited and a CMP performed.

At 412, the process 400 forms a gate contact that has no inner spacer and is electrically coupled to the gate and in contact with the first dielectric gate layer and with the second dielectric gate layer. At 414, the process 400 forms a source/drain contact having a single inner spacer in a diffusion region. For example, in FIG. 3G, the gate contacts 108 are patterned. In FIG. 3H, a metal, such as, for example, Titanium (Ti) or Titanium Nitride (TiN), is deposited as a barrier and a metal fill of the gate contacts 108 and the source/drain contacts 106 is performed. For example, Cobalt (Co), Tungsten (W) or the like may be used for the metal fill of the gate contacts 108 and the source/drain contacts 106. A CMP may be performed, leaving the 2nd layer 126 (e.g., ALD SiN) with a thickness of between about 1 nm to about 5 nm (e.g., on top of each of the gates 104). In FIG. 3I, the local interconnect routings 110 are formed using, for example, Cobalt (Co), Tungsten (W), or the like.

Thus, the process creates a semiconductor that includes a single inner spacer local interconnect, e.g., a single SiN inner spacer in the source/drain contact, but no inner spacer in the gate contact. By using a single inner spacer, the technical advantages of the semiconductor include lower resistance and therefore higher performance, as compared to using a dual inner spacer. The local interconnect includes two layers of dielectric cap on the gate, e.g., a 1st layer that is an oxide-based dielectric (e.g., $SiO_2$), and a 2nd layer that is a nitride-based dielectric (e.g., SiN). As illustrated in FIG. 1, the two layers are seamless in the final stack, providing the technical advantage of reducing (or eliminating) the possibility of a contact short (e.g., between the source/drain contact and the gate contact).

Figure 5:
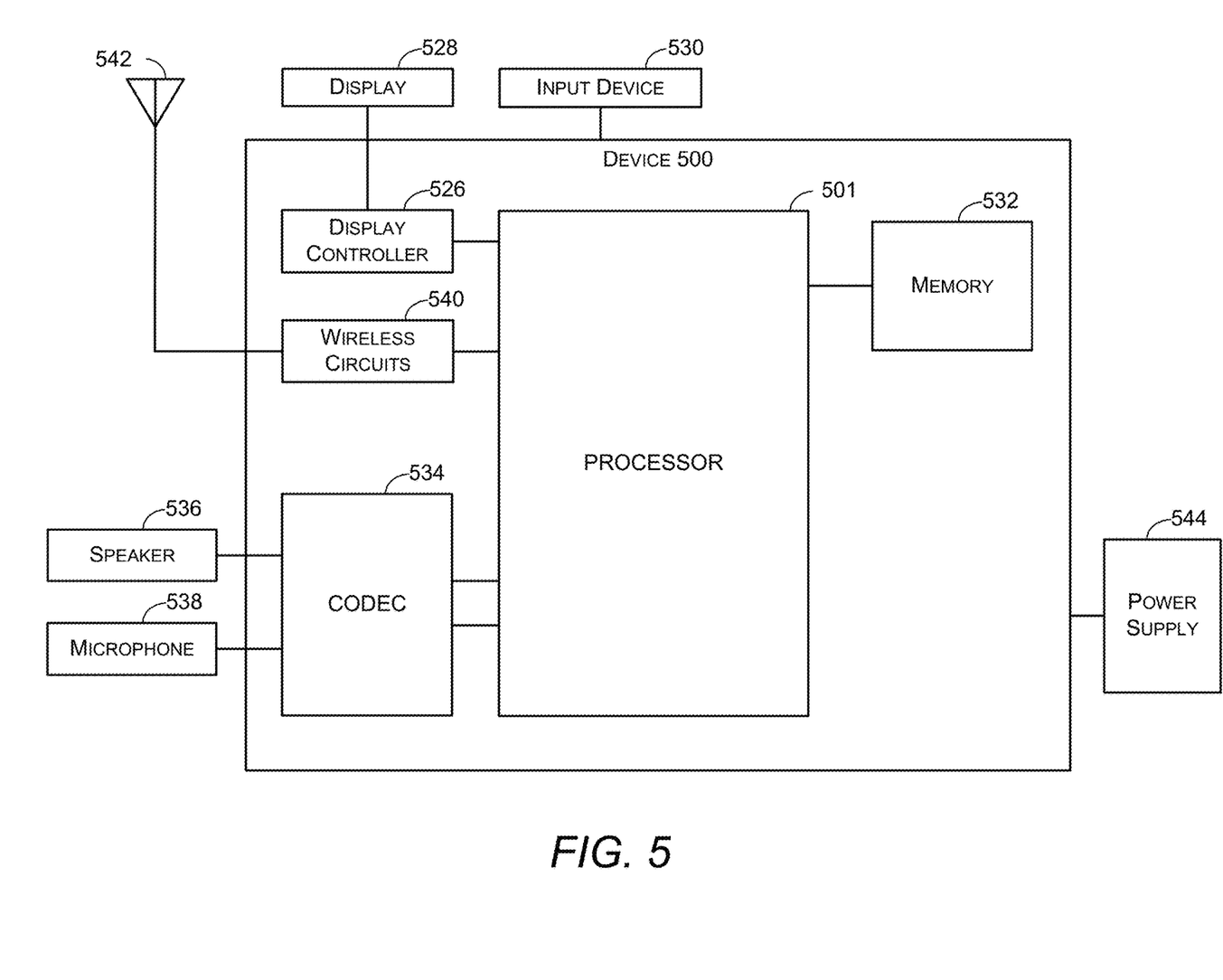
FIG. 5 illustrates an exemplary mobile device in accordance with one or more aspects of the disclosure.

FIG. 5 illustrates an exemplary mobile device 500 in accordance with some examples of the disclosure. Referring now to FIG. 5, a block diagram of a mobile device that is configured according to exemplary aspects is depicted and generally designated mobile device 500. In some aspects, mobile device 500 may be configured as a wireless communication device. As shown, mobile device 500 includes processor 501. Processor 501 may be communicatively coupled to memory 532 over a link, which may be a die-to-die or chip-to-chip link. Processor 501 is a hardware device capable of executing logic instructions. Mobile device 500 also includes display 528 and display controller 526, with display controller 526 coupled to processor 501 and to display 528.

In some aspects, FIG. 5 may include coder/decoder (CODEC) 534 (e.g., an audio and/or voice CODEC) coupled to processor 501; speaker 536 and microphone 538 coupled to CODEC 534; and wireless circuits 540 (which may include a modem, RF circuitry, filters, etc., which may be implemented using a semiconductor that includes a single inner spacer local interconnect, e.g., a single SiN inner spacer in the source/drain contact, but no inner spacer in the gate contact) coupled to wireless antenna 542 and to processor 501.

In a particular aspect, where one or more of the above-mentioned blocks are present, processor 501, display controller 526, memory 532, CODEC 534, and wireless circuits 540 can include the gate structure described herein which may be implemented in whole or part using the techniques disclosed herein. Input device 530 (e.g., physical or virtual keyboard), power supply 544 (e.g., battery), display 528, input device 530, speaker 536, microphone 538, wireless antenna 542, and power supply 544 may be external to the device 500 and may be coupled to a component of the device 500, such as an interface or a controller.

It should be noted that although FIG. 5 depicts a mobile device 500, processor 501 and memory 532 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 6:
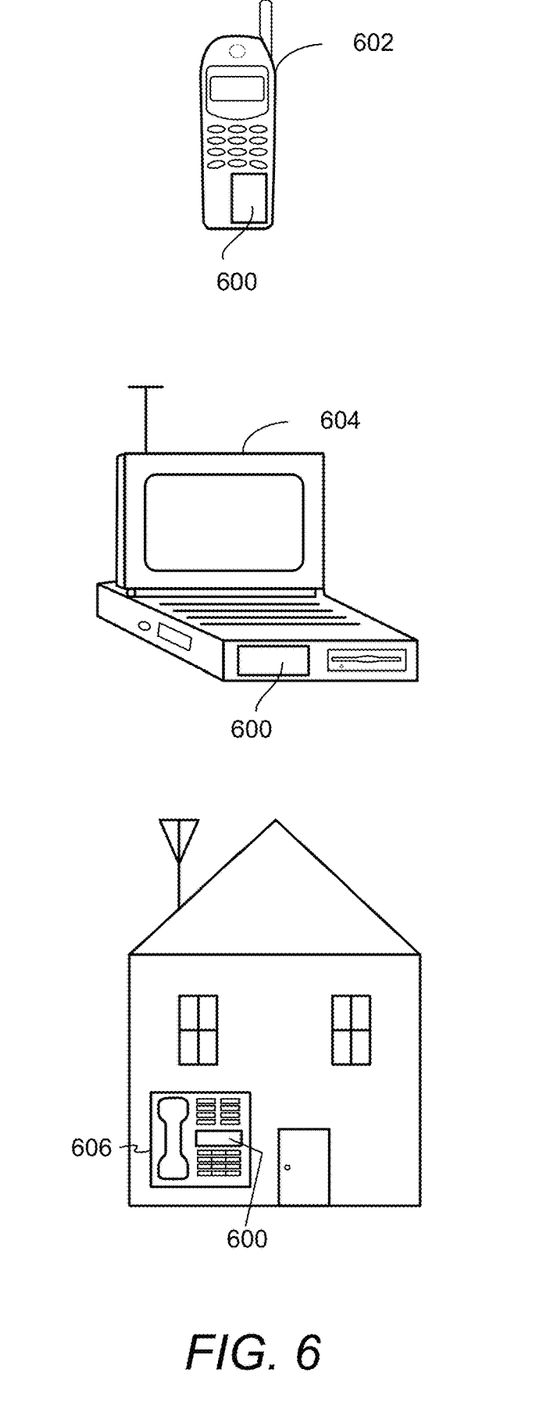
FIG. 6 illustrates various electronic devices that may be integrated with an integrated device or a semiconductor device in accordance with one or more aspects of the disclosure.

FIG. 6 illustrates various electronic devices that may be integrated with any of the aforementioned integrated device or semiconductor device accordance with various examples of the disclosure. For example, a mobile phone device 602, a laptop computer device 604, and a fixed location terminal device 606 may each be considered generally user equipment (UE) and may include semiconductor 600 (e.g., including the semiconductor 100) as described herein. The semiconductor 600 may be, for example, be included in any of the integrated circuits, dies, integrated devices, integrated device packages, integrated circuit devices, device packages, integrated circuit (IC) packages, package-on-package devices described herein. The devices 602, 604, 606 illustrated in FIG. 6 are merely exemplary. Other electronic devices may also feature the semiconductor 600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

It can be noted that, although particular frequencies, integrated circuits (ICs), hardware, and other features are described in the aspects herein, alternative aspects may vary. That is, alternative aspects may utilize additional or alternative frequencies (e.g., other the 60 GHz and/or 28 GHz frequency bands), antenna elements (e.g., having different size/shape of antenna element arrays), scanning periods (including both static and dynamic scanning periods), electronic devices (e.g., WLAN APs, cellular base stations, smart speakers, IoT devices, mobile phones, tablets, personal computer (PC), etc.), and/or other features. A person of ordinary skill in the art will appreciate such variations.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements." For example, this terminology may include A, or B, or C, or A and B, or A and C, or A and B and C, or 2A, or 2B, or 2C, and so on.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause. Implementation examples are described in the following numbered clauses:

Clause 1. An apparatus comprising: a semiconductor die comprising: an insulation layer disposed on a substrate; a gate spacer disposed in the insulation layer; a gate disposed between the gate spacer; a first dielectric gate layer disposed on the gate between the gate spacer; a second dielectric gate layer disposed on the first dielectric gate layer between the gate spacer; a gate contact coupled to the gate and in contact with the first dielectric gate layer and the second dielectric gate layer; and a source/drain contact, wherein the source/drain contact has a single inner spacer.

Clause 2. The apparatus of clause 1, further comprising: a local interconnect disposed on the source/drain contact.

Clause 3. The apparatus of clause 2, wherein the local interconnect is further disposed on the second dielectric gate layer.

Clause 4. The apparatus of any of clauses 1 to 3, wherein the gate contact is located outside of a diffusion region.

Clause 5. The apparatus of any of clauses 1 to 4, wherein: the substrate comprises Silicon.

Clause 6. The apparatus of any of clauses 1 to 5, wherein: the insulation layer comprises Silicon Dioxide.

Clause 7. The apparatus of any of clauses 1 to 6, wherein: the first dielectric gate layer comprises Silicon Dioxide.

Clause 8. The apparatus of any of clauses 1 to 7, wherein: the second dielectric gate layer comprises a Silicon Nitride (SiN) layer.

Clause 9. The apparatus of clause 8, wherein the SiN layer has a thickness of between about 1 nanometer to about 5 nanometers.

Clause 10. The apparatus of any of clauses 1 to 9, wherein: the first dielectric gate layer and the second dielectric gate layer are seamless.

Clause 11. The apparatus of any of clauses 1 to 10, wherein: the single inner spacer of the source/drain contact comprises Silicon Nitride.

Clause 12. The apparatus of any of clauses 1 to 11, wherein the apparatus is selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

Clause 13. A method of forming a semiconductor die, the method comprising: disposing an insulation layer on a substrate; disposing a gate spacer in the insulation layer; disposing a gate between the gate spacer; disposing a first dielectric gate layer on the gate between the gate spacer; disposing a second dielectric gate layer on the first dielectric gate layer between the gate spacer; forming a gate contact coupled to the gate and in contact with the first dielectric gate layer and the second dielectric gate layer; and forming a source/drain contact having a single inner spacer.

Clause 14. The method of clause 13, further comprising: disposing a local interconnect on the source/drain contact.

Clause 15. The method of clause 14, further comprising: disposing the local interconnect on the second dielectric gate layer.

Clause 16. The method of any of clauses 13 to 15, wherein the gate contact is located outside of a diffusion region.

Clause 17. The method of any of clauses 13 to 16, wherein: the substrate comprises Silicon.

Clause 18. The method of any of clauses 13 to 17, wherein: the insulation layer comprises Silicon Dioxide.

Clause 19. The method of any of clauses 13 to 18, wherein: the first dielectric gate layer comprises Silicon Dioxide.

Clause 20. The method of any of clauses 13 to 19, wherein: the second dielectric gate layer comprises a Silicon Nitride (SiN) layer.

Clause 21. The method of clause 20, wherein the SiN layer has a thickness of between about 1 nanometer to about 5 nanometers.

Clause 22. The method of any of clauses 13 to 21, wherein: the first dielectric gate layer and the second dielectric gate layer are seamless.

Clause 23. The method of any of clauses 13 to 22, wherein: the single inner spacer of the source/drain contact comprises Silicon Nitride.

In view of the descriptions and explanations above, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Accordingly, it will be appreciated, for example, that an apparatus or any component of an apparatus may be configured to (or made operable to or adapted to) provide functionality as taught herein. This may be achieved, for example: by manufacturing (e.g., fabricating) the apparatus or component so that it will provide the functionality; by programming the apparatus or component so that it will provide the functionality; or through the use of some other suitable implementation technique. As one example, an integrated circuit may be fabricated to provide the requisite functionality. As another example, an integrated circuit may be fabricated to support the requisite functionality and then configured (e.g., via programming) to provide the requisite functionality. As yet another example, a processor circuit may execute code to provide the requisite functionality.

Moreover, the methods, sequences, and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor (e.g., cache memory).

While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, unless otherwise noted, the functions, steps, and/or actions of the method claims in accordance with the aspects of the disclosure described herein need not be performed in any particular order. Furthermore, although certain aspects may be described or claimed in the singular, the plural is contemplated unless limitation to the singular is explicitly stated.

What is claimed is:

1. An apparatus comprising:
   a semiconductor die comprising:
      an insulation layer disposed on a substrate;
      a gate spacer disposed in the insulation layer;
      a gate disposed between the gate spacer;
      a first dielectric gate layer disposed on the gate between the gate spacer;
      a second dielectric gate layer disposed on the first dielectric gate layer between the gate spacer;
      a gate contact coupled to the gate and in contact with the first dielectric gate layer and the second dielectric gate layer;
      a source/drain contact, wherein the source/drain contact has a single inner spacer; and
      a local interconnect disposed on the source/drain contact, wherein the local interconnect is in contact with the second dielectric gate layer and wherein the gate is not in contact with the second dielectric gate layer.

2. The apparatus of claim 1, wherein the gate contact is located outside of a diffusion region.

3. The apparatus of claim 1, wherein:
the substrate comprises Silicon.

4. The apparatus of claim 1, wherein:
the insulation layer comprises Silicon Dioxide.

5. The apparatus of claim 1, wherein:
the first dielectric gate layer comprises Silicon Dioxide.

6. The apparatus of claim 1, wherein:
the second dielectric gate layer comprises a Silicon Nitride (SiN) layer.

7. The apparatus of claim 6, wherein the SiN layer has a thickness of between about 1 nanometer to about 5 nanometers.

8. The apparatus of claim 1, wherein:
the first dielectric gate layer and the second dielectric gate layer are seamless.

9. The apparatus of claim 1, wherein:
the single inner spacer of the source/drain contact comprises Silicon Nitride.

10. The apparatus of claim 1, wherein the apparatus is selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

11. A method of forming a semiconductor die, the method comprising:
- disposing an insulation layer on a substrate;
- disposing a gate spacer in the insulation layer;
- disposing a gate between the gate spacer;
- disposing a first dielectric gate layer on the gate between the gate spacer;
- disposing a second dielectric gate layer on the first dielectric gate layer between the gate spacer;
- forming a gate contact coupled to the gate and in contact with the first dielectric gate layer and the second dielectric gate layer;
- forming a source/drain contact having a single inner spacer; and
- disposing a local interconnect on the source/drain contact, wherein the local interconnect is in contact with the second dielectric gate layer and wherein the gate is not in contact with the second dielectric gate layer.

12. The method of claim 11, wherein the gate contact is located outside of a diffusion region.

13. The method of claim 11, wherein:
the substrate comprises Silicon.

14. The method of claim 11, wherein:
the insulation layer comprises Silicon Dioxide.

15. The method of claim 11, wherein:
the first dielectric gate layer comprises Silicon Dioxide.

16. The method of claim 11, wherein:
the second dielectric gate layer comprises a Silicon Nitride (SiN) layer.

17. The method of claim 16, wherein the SiN layer has a thickness of between about 1 nanometer to about 5 nanometers.

18. The method of claim 11, wherein:
the first dielectric gate layer and the second dielectric gate layer are seamless.

19. The method of claim 11, wherein:
the single inner spacer of the source/drain contact comprises Silicon Nitride.

* * * * *